United States Patent [19]
Gelsomini et al.

[11] Patent Number: 4,760,555
[45] Date of Patent: Jul. 26, 1988

[54] MEMORY ARRAY WITH AN ARRAY REORGANIZER

[75] Inventors: Tito Gelsomini; Giuliano Imondi, both of Rieti, Italy

[73] Assignee: Texas Instruments Incorporated, Dallas, Tex.

[21] Appl. No.: 854,229

[22] Filed: Apr. 21, 1986

[51] Int. Cl.$^4$ ............................................. G11C 11/40
[52] U.S. Cl. .................................... 365/104; 365/189; 365/203
[58] Field of Search ............... 365/104, 203, 189, 230, 365/94, 221, 103

[56] References Cited

U.S. PATENT DOCUMENTS

4,646,265  2/1987  Takamizawa et al. ............. 365/104

Primary Examiner—Terrell W. Fears
Attorney, Agent, or Firm—Rodney M. Anderson; John G. Graham

[57] ABSTRACT

A non-volatile memory device formed on a face of a semiconductor substrate which includes an array of electrically programmable read only memory cells, a Y address decoder coupled to said array and first and second sets of input/output lines coupled to said Y address decoder. Switch means isolates either the first or second set of input/output lines from the Y decoder. A programmable non-volatile memory element is coupled to programming ones of the input lines and is programmable into a programmed state from an unprogrammed state in response to a programming voltage applied to programming ones of the first set of input lines. A control circuit is coupled to the switch means and to the memory element for isolating the first or second set in response to an external signal applied to a selecting one of the first set of input/output lines and in response to the state of the non-volatile memory element.

12 Claims, 2 Drawing Sheets

MEMORY ARRAY WITH AN ARRAY REORGANIZER

This application is related to application Ser. No. 837,631, filed Mar. 13, 1987 and assigned to Texas Instruments Incorporated.

BACKGROUND OF THE INVENTION

The present invention relates to a memory array on a semiconductor integrated circuit chip with an on-chip circuit for reorganizing the array in response to control signals applied to the circuit. The circuit has general application but is particularly adapted to an EPROM array.

In general, memory circuits are made and sold in fixed arrays without the facility of being able to convert from one memory organization to another except through the use of external hardware. Consequently, if one wishes for example to use both a 64K by 8 and a 128K by 4 array it is necessary to purchase a different chip for each arrangement or use the external hardware referred to above.

Accordingly, it is a principal object of the present application to provide an on chip converter for converting from one organization of array memory cells to another by simply applying control signals to the chip.

SUMMARY OF THE INVENTION

According to the invention there is provided a non-volatile memory device formed on a face of a semiconductor substrate which includes an array of electrically programmable read only memory cells, a column decoder coupled to said array and first and second sets of input/output lines coupled to said column decoder. Switch means isolates either the first or second set of input/output lines from the column decoder. A programmable non-volatile memory element is coupled to programming ones of the input lines and is programmable into a programmed state from an unprogrammed state in response to a programming voltage applied to programming ones of the first set of input lines. A control circuit is coupled to the switch means and to the memory element for isolating the first or second set in response to an external signal applied to a selecting one of the first set of input/output lines and in response to the state of the non-volatile memory element.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
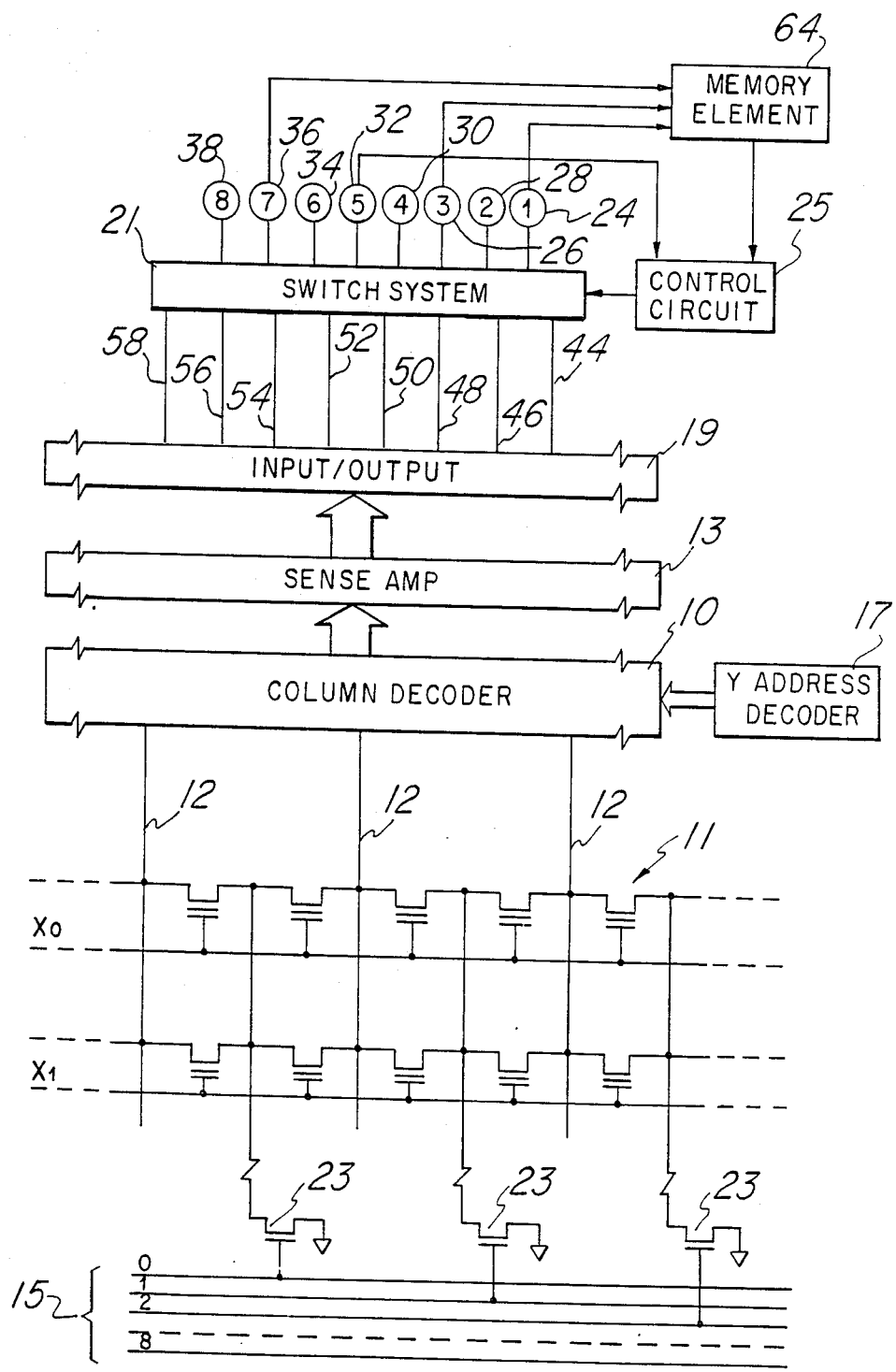
FIG. 1 is a block diagram showing a preferred embodiment of the invention.

Referring to FIG. 1 there is shown an array of electrically programmable read only memory cells (EPROMs) 11 with associated column lines 12 connected to a column decoder 10 and corresponding bit lines coupled through transistors 23 to ground. Coupled to the transistors 23 are virtual ground selection lines 15. A Y address decoder 17 is connected to the column decoder 10 for controlling the operation of the latter. The output of the column decoder 10 goes to a sense amplifier system 13 which could be either a single sense amplifier with selection transistors in each column line 12 or separate sense amplifiers for each column line 12. An input/output interface 19 coupled to the sense amplifier system 13 outputs or receives input from 8 input/output data lines 44, 46, 48, 50, 52, 54, 56, and 58. A switch system 21 in series with the aforesaid input/output lines controls the flow of input and output data into and out of the input/output lines. A control circuit 25 controls the switch system 21 in response to input on input/output terminal 5 and in response to output from a memory element 64 which is non-volatile. Memory element 64 receives programming input from terminals 1 and 3.

Figure 2:
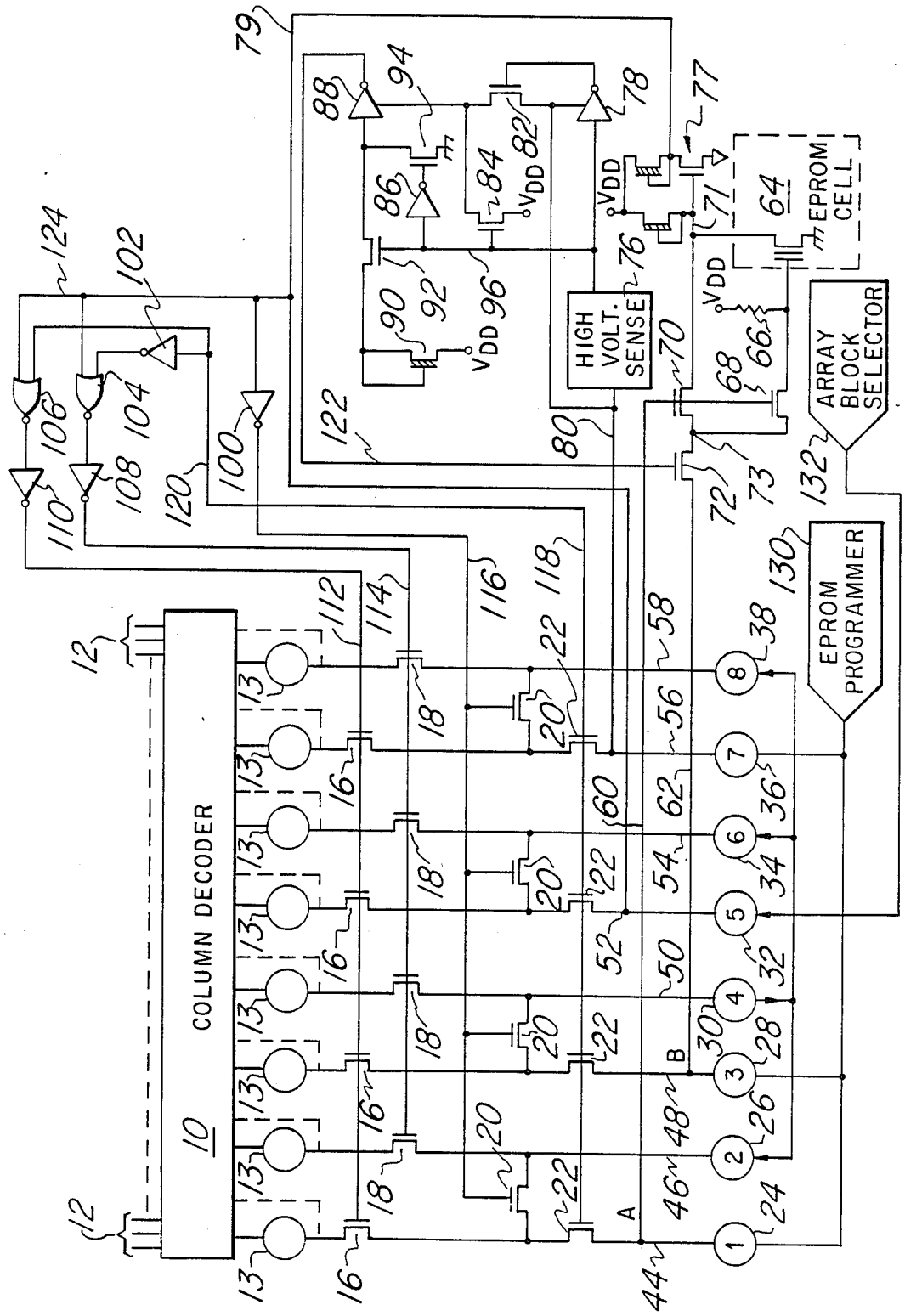
FIG. 2 is a circuit diagram showing the circuitry for reorganizing the array of memory cells.

A more detailed representation of the control circuit, memory element and switch system seen in FIG. 2 consists of four isolating transistors in series with a first set of input/output lines 44, 48, 54 and 58 and four inter line transistors 20 connecting lines 44 and 46, 48 and 50, 52 and 54, and 56 and 58, respectively. Between the column decoder 10 and transistors 20 in series with lines 44, 48, 52, and 56 are transistors 16 and in series with lines 46, 50, 54 and 58 are transistors 18. Individual sense amplifiers 13 couple between transistors 16 and 18 and the column decoder 10 and are shown bypassed by dotted lines for certain functions such as programming. An electrically programmable read only memory element 64 has its source connected to circuit ground and its drain to line 71. The control gate of the EPROM is biased through resistor 66 to $V_{DD}$. The control gate also is coupled to one end of the source to drain path of N-channel transistor 68 and the other end of which connects to function 73. Line 71 also connects to one end of the source to drain path of N-channel transistor 70 and the other end of which connects to junction 73 also. The gates of both transistors 68 and 70 couple to input/output line 44. Junction 73 is connected through the source to drain of an isolating transistor 72 to input/output line 48.

Isolating transistor 72 is gated by a sensing circuit consisting of an inverting high voltage sense circuit 76 connected by line 80 to input/output line 56. The output of the circuit 76 drives inverter 78 and also travels along line 96 to drive the gate of transistor 92, inverter 86 and the gate of transistor 84. The output of inverter 78 drives the gate of transistor 82. Transistor 84 has its drain coupled to the drain of transistor 82 which goes to the power supply line of inverter 88 and its source connected to $V_{DD}$. Depletion mode transistor 90 biases the input of inverter 88 high when transistor 92 is conducting. Inverter 86 drives the gate of transistor 94 which pulls down the input of inverter 88 when transistor 92 is off due to the voltage level on line 96 being low. When the voltage on line 80 is below the threshold value for making the high voltage sense circuit 76 switch, the output of high voltage sense circuit 76 will be high and transistor 92 will be turned on applying $V_{DD}$ to the input of inverter 88. The output of inverter 88 is low which turns off isolating transistor 72. Transistor 84 is driven on putting $V_{DD}$ on the power supply line of inverter 88.

When a high voltage is applied to line 80, sense circuit 76 produces a low output which turns off transistor 92 and turns on transistor 94 placing the input to inverter 88 at ground. The output of inverter 78 is high driving on transistor 82 and placing the high voltage on the power supply line of inverter 88.

The control circuit 25 further includes an inverting sense amplifier 77 made up of a depletion mode transistor biasing line 71 to $V_{DD}$ followed by an inverter. The output of the inverter is coupled by line 79 to transistors 22, through inverter 100 to transistors 20 and to one input of each of NOR gates 104 and 106. The outputs of NOR gates 104 and 106 pass respectively through inverters 108 and 110, on lines 114 and 112 to transistors 18 and 16, respectively. The second input to each of NOR gates 104 and 106 come from line 120 connected to input/output terminal 32. The second input to NOR gate 104 passes first through inverter 102.

This means for applying a 16 volt programming voltage to terminal 24, 28 and 36 is an off chip EPROM programmer 130 while that for applying a 5 volt signal to terminal 32 is an Array Block Selector 132.

Operationally, when EPROM cell 64 is unprogrammed it will be conducting and pull line 71 to ground thereby causing the output of inverter 77 on line 79 to go high and turn on transistors 22. At the same time the signal on line 116 after inverter 100 inverts the signal on line 79 turns off transistors 20. The input on line 124 to NOR gates 104 and 106 will be high resulting in transistors 16 and 18 both being turned on. This corresponds to a full by 8 operation of the array. Any application of voltage by Selector 132 to line 32 has no effect on NOR gates 104 and 106 as both of the latter are disabled by the logic "1" on line 124.

If a by 4 operation of the array is desired then it is necessary to program the EPROM cell 64 so that it is non-conducting with $V_{DD}$ applied to its control gate. In this case EPROM programmer 130 applies 16 volts to terminals 24, 28 and 36. The high voltage on the gates of transistors 68 and 70 turn those transistors on while the high voltage on line 80 as described above turns on transistor 72 applying 16 volts to the control gate of the EPROM 64 and to line 71. The floating gate of the EPROM thus becomes negatively charged by the electron injection from the channel region. Once the high voltage is removed and with Array Block Selector 132 applying 0 volts to terminal 32, the input to NOR gate 104 will be high and that to 106 will be low. Thus, transistors 18 will be on while transistor 16 will be off. The low output on line 79 also turns off transistors 22 and turns on transistors 20. With Selector 132 applying 5 volts to terminal 32, transistors 16 will be on and transistors 18 will be off. Thus, one can move back and forth from one block of by 4 to the other by simply applying and removing 5 volts from terminal 32.

Clearly, other selections of arrangements other than by 8 to by 4 can be obtained.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A memory device, comprising:
   an array of memory cells;
   a column decoder coupled to said array, said column decoder having a first and a second set of output lines;
   a first and a second set of input/output lines;
   switch means, connected between said column decoder and said first and second sets of input/output lines, for selectively connecting said first or second set of input/output lines to said column decoder;
   a programmable non-volatile memory element coupled to a first one of said first set of input/output lines and programmable into a programmed state from an unprogrammed state in response to a programming voltage applied to said first one of said first set of input/output lines; and
   a control circuit coupled to said switch means and to said memory element for controlling said switch means so that both said first and said second set of input/output lines are connected to the first and second sets of output lines of said column decoder, respectively, responsive to said non-volatile memory element being in its unprogrammed state and, responsive to said non-volatile memory element being in its programmed state, for selectively connecting said first or second output lines of said column decoder to said second set of input/output lines in response to an external signal applied to second one of said first set of input/output lines.

2. A device according to claim 1, wherein said memory element is an electrically programmable read only memory element.

3. A device according to claim 1, wherein said switch means includes:
   (a) a plurality of isolating pass transistors, each connected in series between each of said first set of input/output lines and said first set of output lines of said column decoder, each of said isolating pass transistor having its gate coupled to said control circuit so that said isolating pass transistors are conductive responsive to said memory element being in its unprogrammed state;
   (b) a plurality of inter line pass transistors, each connected between the side of each of said isolating pass transistors nearer said column decoder and the adjacent one of said second set of input/output lines, each of said inter line pass transistors having its gate coupled to said control circuit so that said inter line pass transistors are conductive responsive to said memory element being in its programmed state;
   (c) a plurality of first select transistors, each connected in series between each of said first set of output lines of said column decoder and the point at which its associated inter line pass transistor is connected, each of said first select transistors having its gate connected to said control circuit so that said first select transistors are conductive responsive to either said memory element being in its unprogrammed state or said second one of said first set of input/output lines being at a first logic state; and
   (d) a plurality of second select transistors, each connected in series between each of said first set of output lines of said column decoder and the point at which its associated inter line pass transistor is connected, each of said second select transistors having its gate connected to said control circuit so that said second select transistors are conductive responsive to either said memory element being in its unprogrammed state or said second one of said first set of input/output lines being at a second logic state.

4. A device according to claim 1, wherein said control circuit includes:
(a) means for coupling said electrically programmable read only memory element to said first one of said first set of input/output lines in response to a voltage greater than a predetermined limit applied to said first one of said first set of input/output lines; and
(b) logic circuitry having inputs coupled to said memory element and to said second one of said first set of input/output lines, and having outputs coupled to said switch means.

5. A device according to claim 2, including means for applying a programming voltage to said first one of said first set of input/output lines.

6. A device according to claim 2, including means for applying a select signal to said second one of said first set of input/output lines.

7. A device according to claim 4, wherein said memory element coupling means includes:
a program pass transistor having a source-to-drain path connected between said first one of said first set of input/output line and said memory element, and having a gate; and
a pass gate control circuit having an output coupled to the gate of said program pass transistor and having an input connected to said second one of said first set of input/output lines so that, responsive to a voltage at said second one of said first set of input/output lines exceeding a predetermined voltage level, said pass gate control circuit causes said program pass transistor to be conducting.

8. A memory device, comprising:
an array of memory cells;
a column decoder coupled to said array, said column decoder having a first and a second set of output lines;
a first and a second set of input/output lines;
a switch assembly coupled to said first and second set of output lines of said column decoder and to said first and second sets of input/output lines switchable from a normal position to a toggle position such that when in the normal position said assembly connects said first and second set of output lines from said column decoder to said first and second set of input/output lines, respectively, and such that when in the toggle position said assembly selectively connects said first and second set of output lines from said column decoder to said second set of input/output lines in response to a toggle control signal;
an electrically programmable read only memory element coupled to a first one of said first set of input/output lines and programmable into a programmed state from an unprogrammed state in response to a programming voltage applied to said first one of said first set of input/output lines; and
a control circuit coupled to said switch assembly and to said memory element for placing said switch assembly in said normal position responsive to said memory element being in said unprogrammed state, and for placing said switch assembly in said toggle position responsive to said memory element being in said programmed state.

9. A device according to claim 8, wherein said control circuit includes:
(a) a programming circuit connected to said memory element and said first one of said first set of input/output lines for programming said memory element with a voltage received at said first one of said first set of input/output lines which is above a predetermined level;
(b) logic circuitry coupled to said switch assembly, to said memory element for controlling the position of said switch assembly in response to the state of said memory element.

10. A device according to claim 9, wherein said switch assembly includes:
(a) a plurality of isolating pass transistors, each connected in series between each of said first set of input/output lines and said first set of output lines of said column decoder, each of said isolating pass trnasistor having its gate coupled to said control circuit so that said isolating pass transistors are conductive responsive to said memory element being in its unprogrammed state;
(b) a plurality of inter line pass transistors, each connected between the side of each of said isolating pass transistors nearer said column decoder and the adjacent one of said second set of input/output lines, each of said inter line pass transistors having its gate coupled to said control circuit so that said inter line pass transistors are conductive responsive to said memory element being in its programmed state;
(c) a plurality of first select transistors, each connected in series between each of said first set of output lines of said column decoder and the point at which its associated inter line pass transistor is connected, each of said first select transistors having its gate connected to said control circuit so that said first select transistors are conductive responsive to either said memory element being in its unprogrammed state or said second one of said first set of input/output lines being at a first logic state; and
(d) a plurality of second select transistors, each connected in series between each of said first set of output lines of said column decoder and the point at which its associated inter line pass transistor is connected, each of said second select transistors having its gate connected to said control circuit so that said second select transistors are conductive responsive to either said memory element being in its unprogrammed state or said second one of said first set of input/output lines being at a second logic state.

11. A device according to claim 9, including an EPROM programmer coupled to said first one of said first set of input/output lines for applying programming voltages thereto so as to program said memory element.

12. A device according to claim 9, including an array block selected coupled to a one of said first set of input/output lines for applying said toggle control signal thereto.

* * * * *